United States Patent
Mäki et al.

(10) Patent No.: US 9,625,502 B2
(45) Date of Patent: Apr. 18, 2017

(54) METHOD AND ARRANGEMENT IN CONNECTION WITH PHOTOVOLTAIC POWER GENERATOR COMPOSED OF SERIES-CONNECTED PHOTOVOLTAIC MODULES

(71) Applicant: ABB Oy, Helsinki (FI)

(72) Inventors: Anssi Mäki, Tampere (FI); Seppo Valkealahti, Lempäälä (FI)

(73) Assignee: ABB Oy, Helsinki (FI)

( * ) Notice: Subject to any disclaimer, the term of this patent is extended or adjusted under 35 U.S.C. 154(b) by 999 days.

(21) Appl. No.: 13/738,480

(22) Filed: Jan. 10, 2013

(65) Prior Publication Data
US 2013/0197834 A1 Aug. 1, 2013

(30) Foreign Application Priority Data
Jan. 31, 2012 (EP) .................... 12153272

(51) Int. Cl.
*G01R 21/02* (2006.01)
*G05F 1/67* (2006.01)
*G06F 17/00* (2006.01)

(52) U.S. Cl.
CPC .......... *G01R 21/02* (2013.01); *G05F 1/67* (2013.01); *G06F 17/00* (2013.01); *Y02E 10/58* (2013.01)

(58) Field of Classification Search
USPC .......................................... 702/60
See application file for complete search history.

(56) References Cited

U.S. PATENT DOCUMENTS
2011/0307199 A1 12/2011 Klein et al.

FOREIGN PATENT DOCUMENTS
EP 2 395 550 A1 12/2011

OTHER PUBLICATIONS

David L. King, Temperature Coefficients for PV Modules and Arrays: Measurement Methods, Difficulties, and Results, Sandia National Laboratories, Albuquerque, NM, Nov. 5, 1997, 6 pages.*
European Search Report dated Jun. 27, 2012.

(Continued)

*Primary Examiner* — Tung Lau

(57) ABSTRACT

A method and an arrangement are provided in connection with a photovoltaic power generator composed of series-connected photovoltaic modules. The method includes determining a maximum power point voltage ($U_{MPP}$) and a maximum power point current ($I_{MPP}$). The method also includes determining the ambient temperature ($T_{amb}$), calculating an estimated maximum power point voltage ($U_{est}$) by using maximum power point current ($I_{MPP}$) and the determined ambient temperature ($T_{amb}$), comparing the estimated maximum power point voltage with the determined maximum power point ($U_{MPP}$), and determining on the basis of the comparison whether the generator is operating under uniform conditions or in conditions with two maximum power points.

8 Claims, 5 Drawing Sheets

(a)

(b)

(56) References Cited

OTHER PUBLICATIONS

Patel et al., "Maximum Power Point Tracking Scheme for PV Systems Operating Under Partially Shaded Conditions", vol. 55, No. 4, Apr. 1, 2008, pp. 1689-1698.
Yuya et al., "A MPPT Control Method for Stand-Alone Photovoltaic System in Consideration of Partial Shadow", Dec. 5, 2011, pp. 1010-1014.
Bazzi et al., "Simulation of a New Maximum Power Point Tracking Technique for Multiple Photovoltaic Arrays", May 18, 2008, pp. 175-178.

* cited by examiner

METHOD AND ARRANGEMENT IN CONNECTION WITH PHOTOVOLTAIC POWER GENERATOR COMPOSED OF SERIES-CONNECTED PHOTOVOLTAIC MODULES

RELATED APPLICATION

This application claims priority under 35 U.S.C. §119 to European Patent Application No. 12153272.5 filed in Europe on Jan. 31, 2012, the entire content of which is hereby incorporated by reference in its entirety.

FIELD

The present disclosure relates to series-connected photovoltaic modules, and more particularly to recognizing a situation having two maximum power points.

BACKGROUND INFORMATION

Photovoltaic power generator systems are becoming more and more popular. For extracting the maximum available power from the photovoltaic modules, the system includes a maximum power point tracker (MPPT). Maximum power point trackers operate in such a manner that the output voltage and current of the modules are at an operating point that maximizes the power output from the module. There are multiple known tracking methods available which basically operate by changing the output voltage of the modules and calculate if the power from the modules increases or decreases. This calculation is carried out during the operation of the photovoltaic generator since the operating conditions can vary. The maximum power point may change for example due to clouds shadowing the modules or due to change of the relative position of the sun.

Photovoltaic modules are usually connected in series or parallel to increase the power rating of the power generator. When modules are connected in series, the voltage and, therefore, also the power ratings of the system increase. The series connection of modules can produce situations in which the series-connected modules receive irradiation unevenly. These situations may lead to a state in which the maximum power point tracker sets the operation point of the converter at the output of the series-connected modules to a power point that is not the maximum power point.

The electrical characteristic of a photovoltaic (PV) power generator under uniform irradiance conditions has only one local and, therefore, global maximum power point (MPP) at which the maximum available power can be extracted. This is illustrated in FIG. 1 (a) which shows the power of the generator as a function of voltage. If the generator is, for example, partially shaded (part of the series-connected PV modules are shaded), the electrical characteristic has two local MPPs. An example of the electrical characteristic under such a condition is shown in FIG. 1 (b). It can be seen in FIG. 1 (b) how the obtainable power has two local maximum points marked as MPP.

As mentioned above, the maximum power point tracker may set the converter of the solar photovoltaic power system to operate at a maximum power point that is not the global maximum power point. If the system includes a series connection of photovoltaic modules and the system may have multiple maximum power points, the MPP tracker may be operated in such a way that it scans through the operation points of the series connection to find out if there is an operation point from which more power could be extracted. This scanning of the operation points is time-consuming since it has to be carried out regularly even if the operation of the system is in the only or global maximum power point. Further, the time the scanning of the operation point takes is lost from the operation at the maximum power point. During the repetitive sweeps, some energy is lost.

SUMMARY

An exemplary embodiment of the present disclosure provides a method in connection with a photovoltaic power generator composed of series-connected photovoltaic modules. The exemplary method includes determining a maximum power point voltage ($U_{MPP}$) and a maximum power point current ($I_{MPP}$), and determining the ambient temperature ($T_{amb}$). The exemplary method also includes calculating an estimated maximum power point voltage ($U_{est}$) by using maximum power point current ($I_{MPP}$) and the determined ambient temperature ($T_{amb}$), and comparing the estimated maximum power point voltage with the determined maximum power point ($U_{MPP}$). In addition, the exemplary method includes determining on the basis of the comparison whether the generator is operating under uniform conditions or in conditions with two maximum power points.

An exemplary embodiment of the present disclosure provides a non-transitory computer-readable recording medium having a computer program recorded thereon that causes a processor of a computer processing device to carry out operations in connection with a photovoltaic power generator composed of series-connected photovoltaic modules. The program causes the processor of the computer processing device to carry out operations which include: determining a maximum power point voltage ($U_{MPP}$) and a maximum power point current ($I_{MPP}$); determining the ambient temperature ($T_{amb}$); calculating an estimated maximum power point voltage ($U_{est}$) by using maximum power point current ($I_{MPP}$) and the determined ambient temperature ($T_{amb}$); comparing the estimated maximum power point voltage with the determined maximum power point ($U_{MPP}$); and determining on the basis of the comparison whether the generator is operating under uniform conditions or in conditions with two maximum power points.

An exemplary embodiment of the present disclosure provides an arrangement in connection with a photovoltaic power generator composed of series-connected photovoltaic modules. The exemplary arrangement includes means for determining a maximum power point voltage ($U_{MPP}$) and a maximum power point current ($I_{MPP}$), and means for determining the ambient temperature ($T_{amb}$). The exemplary arrangement also includes means for calculating an estimated maximum power point voltage ($U_{est}$) by using the maximum power point current ($I_{MPP}$) and the determined ambient temperature ($T_{amb}$), and means for comparing the estimated maximum power point voltage with the determined maximum power point ($U_{MPP}$). In addition, the exemplary apparatus includes means for determining on the basis of the comparison whether the generator is operating under uniform conditions or in conditions with two maximum power points.

BRIEF DESCRIPTION OF THE DRAWINGS

Additional refinements, advantages and features of the present disclosure are described in more detail below with reference to exemplary embodiments illustrated in the drawings, in which.

DETAILED DESCRIPTION

Figure 1:
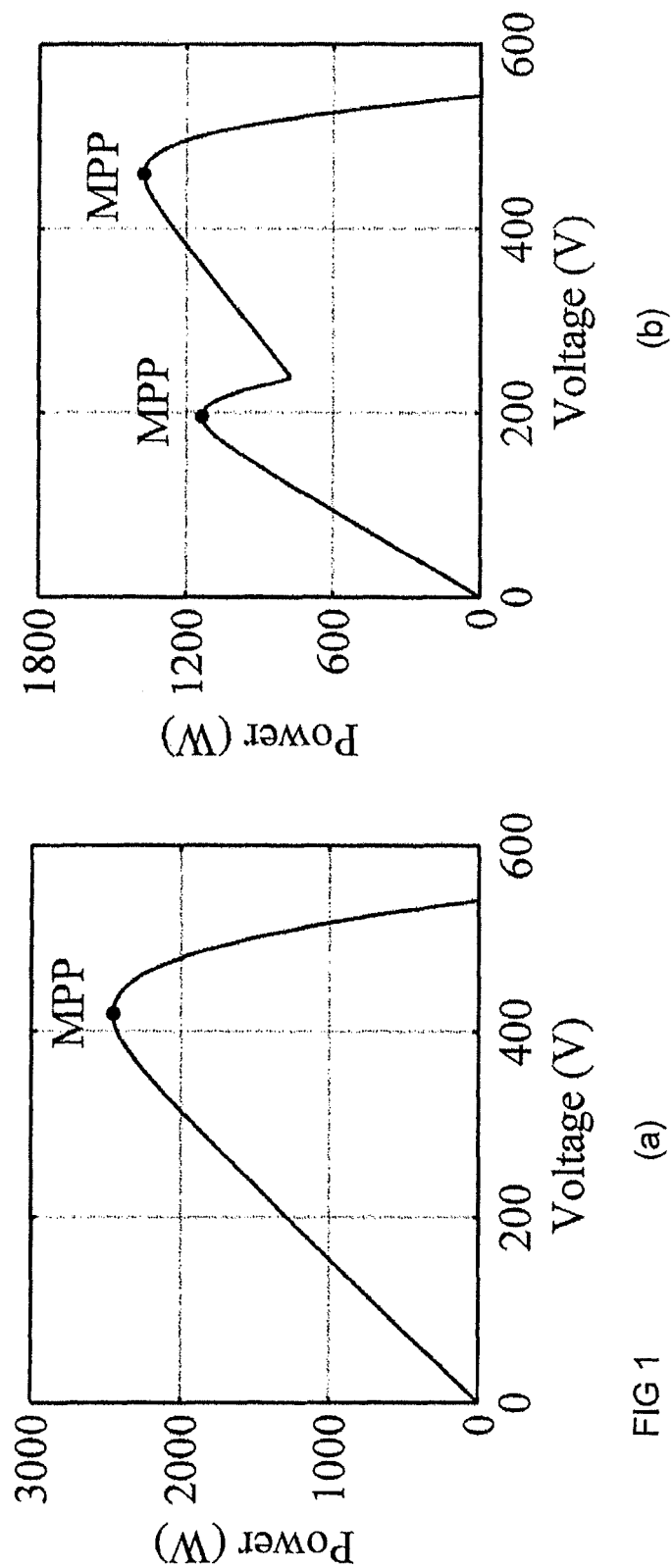
FIG. 1 shows electrical characteristics of a PV power generator operating under (a) uniform and (b) partial shading conditions.

Exemplary embodiments of the present disclosure provide a method and an arrangement for implementing the method so as to alleviate the above disadvantages. Exemplary embodiments of the present disclosure provide a method and apparatus in connection with a photovoltaic power generator composed of series-connected photovoltaic modules, as well as a non-transitory computer-readable recording medium having a computer program recorded thereon that causes a processor of a computer processing device to implement the method.

Exemplary embodiments of the present disclosure are based on the idea of estimating the maximum power point voltage and comparing it with the voltage of the current operation point, which is one of the local maximum power points. These two voltages are compared and from the comparison it is concluded if there is a possibility that the current operation point is not the actual global maximum power point.

An advantage of the method and apparatus of the disclosure is that if the method concludes that only one maximum power point exists or the current operation point is the global operation point, then there is no need for carrying out the scan through the operation points.

The present disclosure relates to a method and apparatus for recognizing two maximum power point conditions of a PV power generator composed of series-connected PV modules. The method is based on comparison of the measured MPP voltage with the estimated MPP voltage under uniform irradiance conditions.

In the method according to the present disclosure, the maximum power point voltage and current are determined. This determination is carried out by using a method that can produce a maximum power point in which the PV power generator may operate. Examples of maximum power point tracking methods include incremental conductance and perturb-and-observe methods. Basically, the operation point of the modules, for example, maximum power point current and voltage, is measured and the measured values are forwarded to the method of the present disclosure.

In the method according to the present disclosure, the ambient temperature is determined and an estimated maximum power point voltage is calculated using the maximum power point current $I_{MPP}$ and the determined ambient temperature.

The estimated maximum power point voltage is compared with the determined maximum power point. Based on the comparison between the estimated and determined maximum power points, it is determined if the PV power generator is operating under uniform conditions or in conditions with two maximum power points.

When the estimated and determined maximum power point voltages differ more than a pre-determined amount, then it is concluded that there are two maximum power points.

The MPP voltage estimated in the method is the MPP voltage under uniform conditions. The estimation is based on the number and type of the series-connected PV modules and operating conditions, such as irradiance, ambient temperature and temperature of the PV modules. The determined MPP current is used for estimation of the irradiance of the series-connected PV modules. By using the measured MPP current and ambient temperature, the temperature of the modules can be estimated by using the temperature-rise coefficient, which is used for determining the temperature rise of the PV modules over the ambient temperature due to the irradiance.

Figure 2:
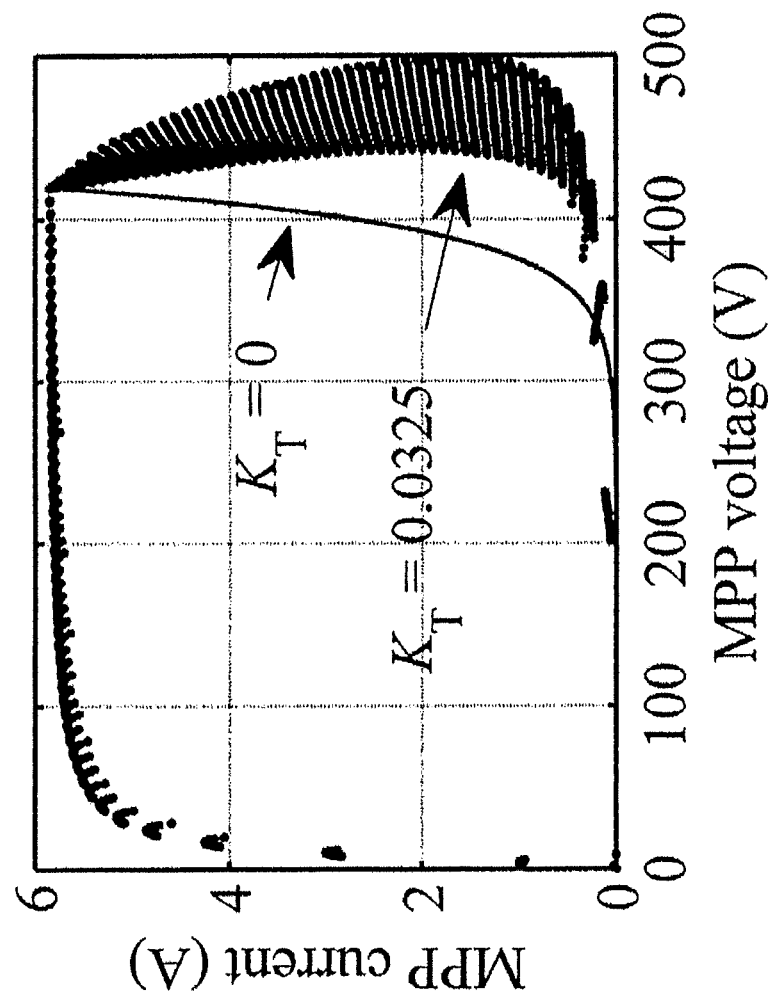
FIG. 2 shows maximum power point voltages and currents for 18 series-connected PV modules.

The MPP voltages and currents are shown in FIG. 2 for a PV power generator composed of 18 series-connected PV modules under partial shading conditions. The irradiance of the non-shaded PV modules is 800 W/m². In this example, the partial shading of the generator is obtained by shading one part of a PV module at a time. The strength of the shading is also varied. FIG. 2 also contains MPPs under uniform conditions when all the PV modules are shaded. MPPs in these cases are the leftmost dots in the group of points at high voltages. As can be seen, the MPP current in these cases varies because of the varying shading strength.

The solid line in FIG. 2 illustrates the MPPs under uniform conditions, when the temperature-rise coefficient is zero (KT=0 (K/W/m²)), which means that the temperature of the PV modules does not rise due to the irradiance, but remains at ambient temperature. This is not a realistic case. The temperature-rise coefficient KT=0.0325 Km²/W has been calculated from a technical description of the PV modules, which gives the temperature of the PV modules under nominal operating conditions (NOC). The temperature-rise coefficient is a PV module-dependent coefficient.

As can be seen in FIG. 2, the MPP is either at currents near 6 A (corresponding to the irradiance of 800 W/m²) or voltages near 450 V. The former represents MPP at lower voltages and the latter MPP at higher voltages as illustrated in FIG. 1 (b). It can be seen that the voltage of the MPPs at lower voltages differs notably from the MPP voltage under uniform conditions (red dots). This is not true for MPPs at higher voltages. For them, the MPP voltages are quite close to the MPP voltage under uniform conditions. The MPPs at higher voltages are illustrated in an extended view in FIG. 3. The gray scaling represents different operating and shading conditions.

Figure 3:
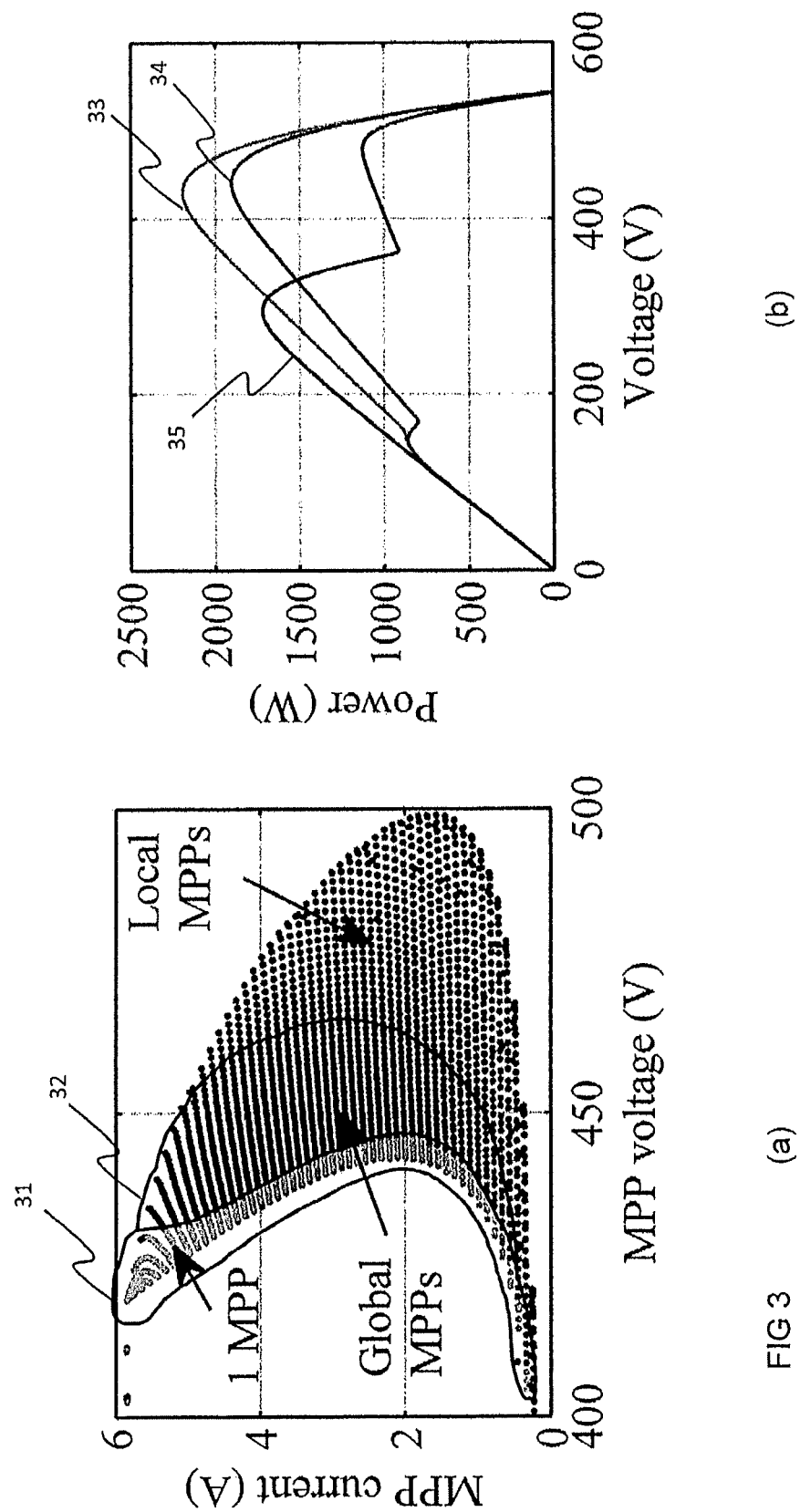
FIG. 3 shows (a) MPPs at higher voltages and (b) corresponding electrical characteristics.

As can be seen in FIG. 3 (a), the dots 31 near the MPPs under uniform conditions are, in fact, MPPs under such operating and shading conditions that there is only one MPP. This is illustrated with curve 33 in FIG. 3 (b). Curve 33 bends around 180 V, but doesn't contain a local MPP.

Next MPPs in FIG. 3 (a) (from left to right) are marked with 32. These MPPs are global MPPs, which means that the local MPP at higher voltages has more power than the MPP at lower voltages. This is illustrated with curve 34 in FIG. 3 (b). Finally, the remaining dots are local MPPs, which have less power than the MPPs at lower voltages. This is shown in FIG. 3 (b) with curve 35.

The present disclosure is based on the observed behavior of the PV power generator with two maximum power points. Because the MPP current is almost directly proportional to the irradiance received by the PV modules, the MPP voltage under uniform conditions can be estimated accurately (the leftmost MPP dots at high voltages in FIG. 2) by measuring the ambient temperature and the current of a local MPP at which the system operates and by calculating the temperature of the PV modules by using the temperature-rise coefficient KT.

As mentioned earlier, if the PV power generator is operating at an MPP at lower voltages, the MPP voltage differs greatly from the estimated MPP voltage. This is not true for the MPPs at higher voltages. But as can be seen in FIG. 3 (a), the MPPs closest to the MPPs under uniform conditions (dots in area 31) are, in fact, MPPs with one MPP. The next closest MPPs (dots in area 32) are the global MPPs. This indicates that although a two-maximum-power-points condition would not be recognized in case of slight error in estimated MPP voltage, the PV power generator would still be operating at the global MPP and no power would be lost, because of the non-optimal operating point.

The more the measured MPP differs from the estimated MPP, the more probable it is to have an MPP with more power at lower voltages. This is illustrated in FIGS. 4 (a) and (b), where system shading represents the amount of shaded PV modules and shading strength the attenuation of the irradiance due to the shading (ratio of the amount of attenuated irradiance to the irradiance received by the non-shaded PV modules).

Figure 4:
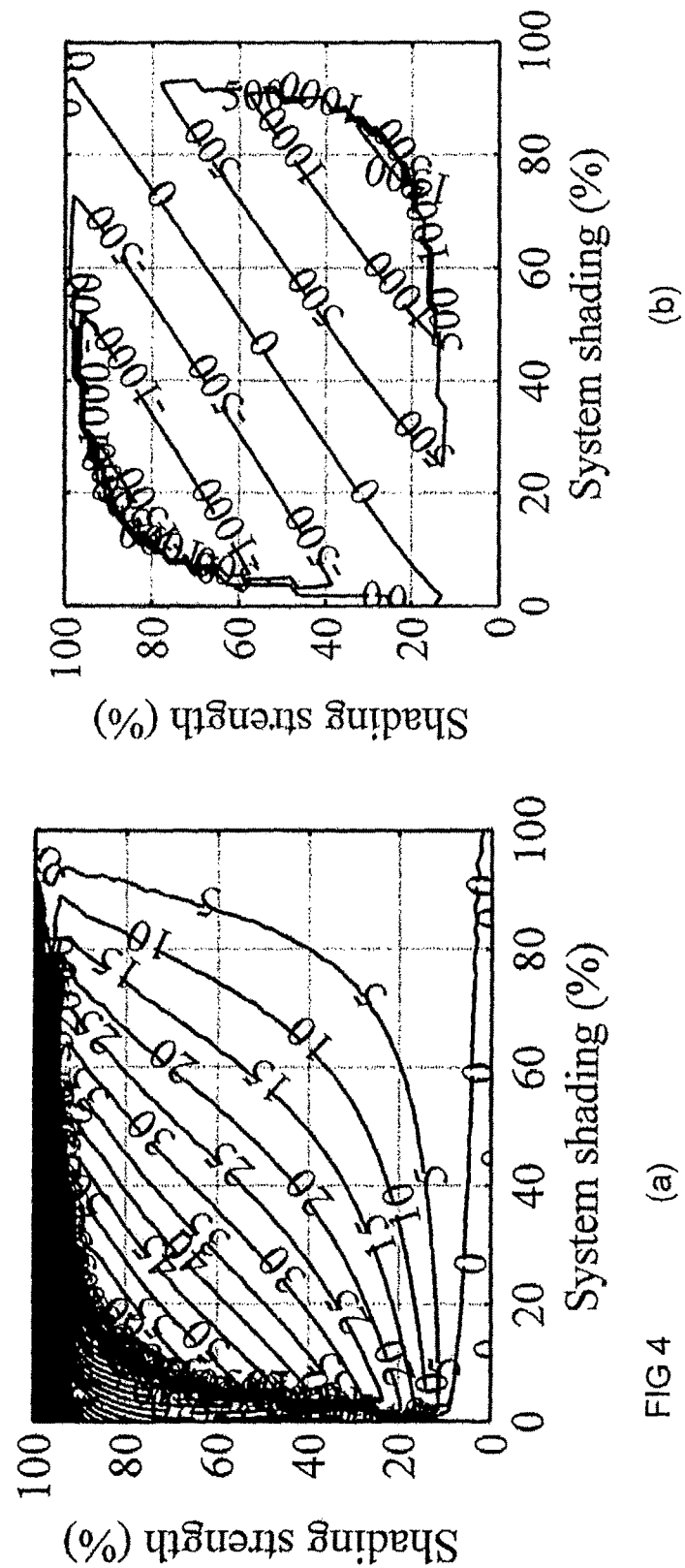
FIG. 4 shows (a) the voltage difference between the measured MPP voltage and estimated MPP voltage in case of an MPP at higher voltages, and (b) the power difference between the MPP at higher voltages and the MPP at lower voltages.

As can be seen in FIG. 4 (a), the voltage difference increases when moving from the bottom right to the top left corner of the figure. As can be seen, the same happens with the power difference in FIG. 4 (b). At some point close to the diagonal, the power difference is zero, as can be seen in FIG. 4 (b). In FIG. 4 (a), on the same diagonal the voltage difference between the measured and estimated MPPs is around 20 V, which can be used as an indication of the partial shading conditions in a control algorithm of a PV power generator composed of series-connected PV modules. A voltage difference of 20 V is for 18 series-connected silicon-based PV modules about 4% of the nominal open-circuit voltage.

It can be shown that, if the temperature variation due to irradiance is not taken into account, the limit for the voltage difference is approximately $U_{diff}=N_c(U_{MPP1}-U_{MPP2})$, where $N_c$ is the total number of series-connected PV cells, $U_{MPP1}$ the MPP voltage of a non-shaded PV cell and $U_{MPP2}$ the MPP voltage of a shaded PV cell. If the effect of temperature-rise on the MPP voltage due to irradiance is taken into account, the voltage difference $U_{MPP1}-U_{MPP2}$ is about 0.021 V for a silicon-based PV cell and it is affected by the temperature-rise coefficient $K_T$ so that a higher $K_T$ yields a lower $U_{diff}$. In the case of 18 series-connected PV modules each having 54 series-connected PV cells, $U_{diff}$ is roughly 20.4 V corresponding to the example cases presented in FIGS. 1 to 4.

In the following, the present disclosure is explained with reference to the block diagram of FIG. 5 which shows an exemplary embodiment of the method according to the present disclosure. The current and voltage of the photovoltaic (PV) power generator as well as the ambient temperature of the generator are measured in blocks 53 and 54 in order to estimate the voltage of the MPP that the generator would have under uniform conditions.

Figure 5:
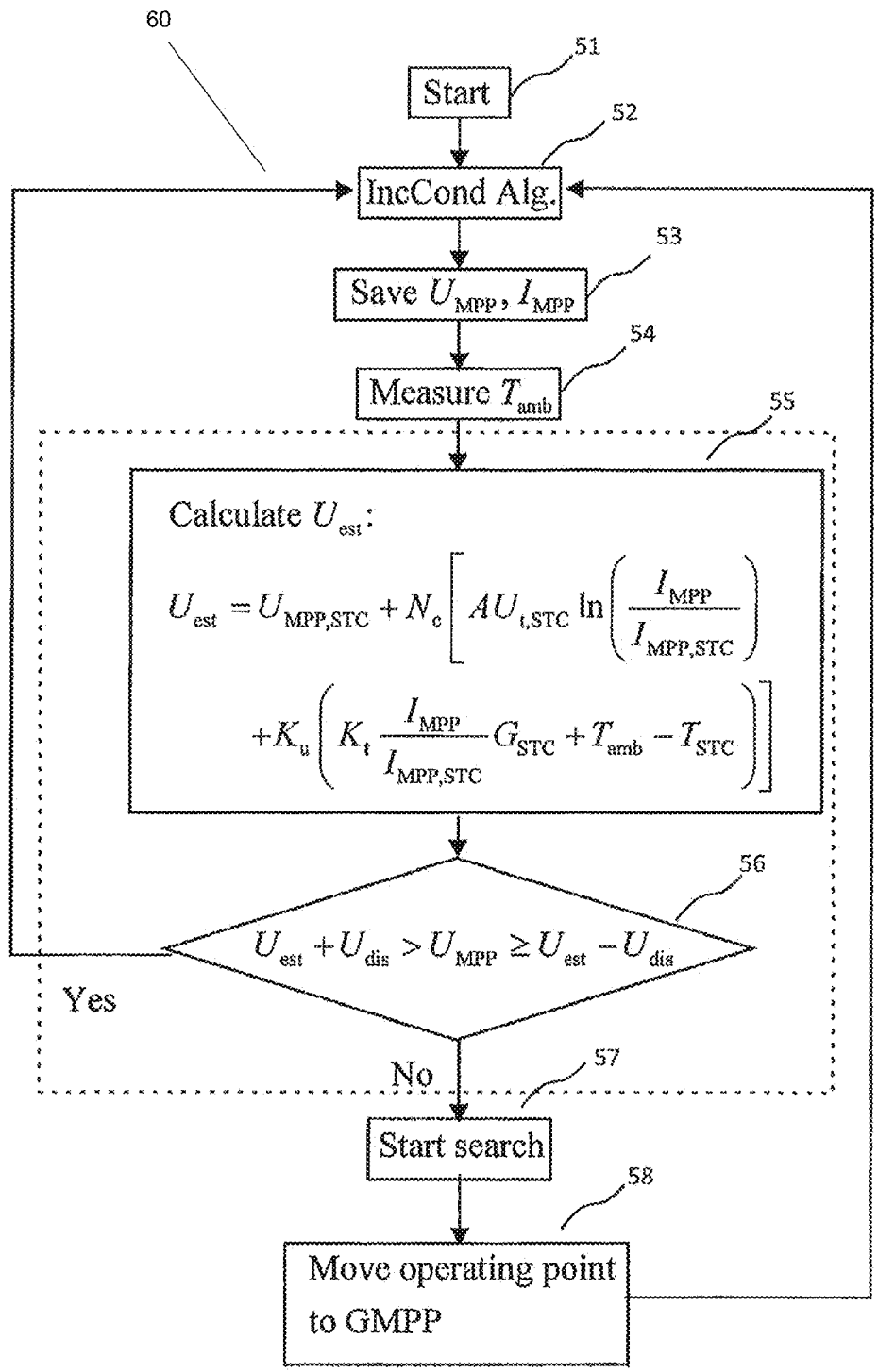
FIG. 5 shows a block diagram of the maximum power point tracking algorithm with an exemplary embodiment of the method according to the present disclosure.

In the block diagram of FIG. 5, the method is started in block 51, and IncCond in block 52 refers to a MPP tracking algorithm Incremental Conductance, which moves the operating point to a nearest maximum on a power-voltage curve of the PV power generator. UMPP and IMPP are the voltage and current of a local MPP reached and saved in block 53 by the IncCond algorithm. Tamb is the ambient temperature measured in block 54.

The exemplary embodiment utilizes information about the local MPP and ambient temperature in order to estimate the voltage of the MPP, Uest, if the PV power generator would operated in uniform conditions with irradiance corresponding to the measured current of the MPP. It is calculated in block 55 in the example as $$U_{est} = U_{MPP,STC} + N_c\left[AU_{t,STC}\ln\left(\frac{I_{MPP}}{I_{MPP,STC}}\right) + K_u\left(K_t\frac{I_{MPP}}{I_{MPP,STC}}G_{STC} + T_{amb} - T_{STC}\right)\right]$$

in which $U_{MPP,STC}$ is the MPP voltage of the PV power generator in standard test conditions (STC) given by the manufacturer of the PV modules, $N_c$ the number of series-connected PV cells, A the PV module ideality factor (typical value for silicon PV modules is between 1 and 2), $U_{t,STC}$ the thermal voltage of a PV cell in STC, $I_{MPP,STC}$ the current of the MPP in STC, $I_{MPP}$ the measured current of a local MPP reached by the IncCond, $K_u$ the temperature dependence of the open circuit voltage (−0.0023 V/K for a silicon solar cell in 300 K), $K_t$ the temperature-rise coefficient, which represents the dependence of the module temperature on irradiance, $G_{STC}$ the irradiance in STC and $T_{STC}$ the temperature of the PV modules in STC.

In the next block 56, the algorithm compares the measured MPP voltage UMPP to the estimated MPP voltage Uest and decides whether the generator is operating under uniform conditions or in conditions with two maximum power points. Udis is used to define a voltage range for estimated MPP voltage. If the MPP voltage is inside the voltage range, the algorithm decides that the current operation is a global MPP or the power difference from the global MPP is minor. In this case the operating conditions are, in fact, uniform or the current operation point is the global MPP or only minor power losses occur due to operation in a local MPP instead of a global one. If the measured MPP voltage is outside this range, the algorithm concludes that the generator has two MPPs on its power-voltage curve and the current operation point is most likely not the global MPP.

In the next step, the control can be returned to the IncGond in block 52, or some kind of search for the global MPP (GMPP) can be initialized 58.

The equation presented for estimated voltage $U_{est}$ can be substituted by another equation which may be simpler than the presented one. The voltage may be estimated in a simplified manner if, for example, the temperature of the modules is measured directly. Then, the estimated voltage can be calculated simply by replacing $K_T(I_{MPP}/I_{MPP,STC})$ $G_{STC}+T_{amb}$ in the equation with $T_{mod}$, where $T_{mod}$ is the measured temperature of the PV modules. The equation presented for estimated voltage $U_{est}$ can also be substituted by a simpler equation, where the module temperature rise due to irradiance is ignored or even the voltage drop due to increased irradiance is ignored. After these simplifications $U_{est}=U_{MPP,STC}$. These simplifications will decrease the accuracy of the method and arrangement to some extent.

An arrangement 60 according to any one of the embodiments may be implemented by means of a non-transitory computer readable recording medium 60 (e.g., a non-volatile memory) having a computer program recorded thereon that causes a processor of a computer processing device or corresponding digital signal processing equipment to execute the software program and carry out the operative features described herein. Such a computer processing device or digital signal processing equipment can include at least a non-volatile memory such as a read-only memory (ROM), hard disk drive, flash memory, optical memory, etc., a working memory (RAM) providing a storage area for arithmetic operations and a central processing unit (CPU), such as a general-purpose digital signal processor. The CPU may include a set of registers, an arithmetic logic unit, and a control unit. The control unit is controlled by a sequence of program instructions transferred to the CPU from the RAM. The control unit may contain a number of microinstructions for basic operations. The implementation of the microinstructions may vary depending on the CPU design. The program instructions may be coded by a programming language, which may be a high-level programming language, such as C or Java or a low-level programming language, such as a machine language, or an assembler. The computer may also have an operating system which may provide system services to a computer program written with the program instructions. The computer or other apparatus implementing the disclosure can also include suitable input means for receiving measurement and/or control data, for example, the input means thus enabling the monitoring of current and voltage quantities, for example, and output means for outputting fault alarms and/or control data, for example. It is also possible to use a specific integrated circuit or circuits, and/or discrete components and devices for implementing the functionality according to any one of the embodiments.

The present disclosure can be implemented in existing system elements, such as various MPP trackers or other controllers used in connection with a series connection of PV modules, or by using separate dedicated elements or devices in a centralized or distributed manner. Present MPP trackers or inverter structures in connection with PV modules including processors and memory that can be utilized in the functions according to the exemplary embodiments of the present disclosure. Thus, all modifications and configurations required for implementing an embodiment of the present disclosure may be performed by appropriate processing circuitry executing software routines tangibly recorded on a non-transitory computer readable recording medium (e.g., a non-volatile memory), where such software routines may be implemented as added or updated software routines. If the functionality of the present disclosure is implemented by processing circuitry executing appropriately programmed software tangibly recorded on a non-transitory computer-readable recording medium, such software can, when run on a computer, causes the computer or corresponding arrangement to perform the functionality according to the disclosure as described above. Such a computer program code may be stored or generally embodied on a non-transitory computer readable recording medium, such as a non-volatile memory, for example a flash memory or a disc memory from which it is loadable to the unit or units executing the program code. In addition, such a computer program code implementing the present disclosure may be loaded to the unit or units executing the computer program code via a suitable data network, for example, and it may replace or update a possibly existing program code.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A method for recognizing partial shading conditions of a photovoltaic power generator composed of series-connected photovoltaic modules, the method comprising:
    determining a maximum power point of the photovoltaic power generator having a maximum power point voltage and a maximum power point current; the maximum power point being defined as an output power of the photovoltaic modules that increases and decreases, the maximum power point voltage and the maximum power point current being a voltage and a current, respectively, of the photovoltaic modules at the maximum power point;
    operating the photovoltaic power generator at the determined maximum power point;
    determining the ambient temperature;
    calculating an estimated maximum power point voltage by using the maximum power point current and the determined ambient temperature;
    calculating a difference between the estimated maximum power point voltage and the determined maximum power point voltage;
    comparing the calculated difference to a pre-determined voltage difference value;
    determining on the basis of the comparison whether the photovoltaic power generator is operating under uniform conditions or in conditions with two maximum power points;
    initiating a search for another maximum power point if it is determined that the generator is operating in conditions with two maximum power points; and
    moving the operation point to another maximum power point if it is determined that the other maximum power point is a global maximum power point.

2. A method according to claim 1, wherein the calculating of the estimated maximum power point voltage comprises using data relating to the used photovoltaic modules.

3. A method as claimed in claim 1, wherein the method is repeated continuously.

4. A non-transitory computer-readable recording medium having a computer program recorded thereon that causes a processor of a computer processing device to carry out operations for recognizing partial shading conditions of a photovoltaic power generator composed of series-connected photovoltaic modules, the operations comprising:
    determining a maximum power point of the photovoltaic power generator having a maximum power point voltage and a maximum power point current; the maximum power point being defined as an output power of the photovoltaic modules that increases and decreases, the maximum power point voltage and the maximum power point current being a voltage and a current, respectively, of the photovoltaic modules at the maximum power point;
    operating the photovoltaic power generator at the determined maximum power point;
    determining the ambient temperature;
    calculating an estimated maximum power point voltage by using maximum power point current and the determined ambient temperature;

calculating a difference between the estimated maximum power point voltage and the determined maximum power point voltage;
comparing the calculated difference to a pre-determined voltage difference value;
determining on the basis of the comparison whether the photovoltaic power generator is operating under uniform conditions or in conditions with two maximum power points;
initiating a search for another maximum power point if it is determined that the generator is operating in conditions with two maximum power points; and
moving the operation point to another maximum power point if it is determined that the other maximum power point is a global maximum power point.

5. The non-transitory computer-readable recording medium according to claim 4, wherein the calculating of the estimated maximum power point voltage comprises using data relating to the used photovoltaic modules.

6. The non-transitory computer-readable recording medium according to claim 4, wherein the operations are repeated continuously.

7. An arrangement for recognizing partial shading conditions of a photovoltaic power generator composed of series-connected photovoltaic modules, the arrangement comprising:
means for determining a maximum power point of the photovoltaic power generator having a maximum power point voltage and a maximum power point current; the maximum power point being defined as an output power of the photovoltaic modules that increases and decreases, the maximum power point voltage and the maximum power point current being a voltage and a current, respectively, of the photovoltaic modules at the maximum power point;
means for operating the photovoltaic power generator at the determined maximum power point;
means for determining the ambient temperature;
means for calculating an estimated maximum power point voltage by using the maximum power point current and the determined ambient temperature;
means for calculating a difference between the estimated maximum power point voltage and the determined maximum power point voltage;
means for comparing the calculated difference to a pre-determined voltage difference value;
means for determining on the basis of the comparison whether the photovoltaic power generator is operating under uniform conditions or in conditions with two maximum power points;
means for initiating a search for another maximum power point if the means for determining determine that the generator is operating in conditions with two maximum power points;
means for moving the operation point to another maximum power point if the means for determining determine that the other maximum power point is a global maximum power point.

8. The arrangement according to claim 7, wherein the means for calculating the estimated maximum power point voltage use data relating to the used photovoltaic modules.

* * * * *